(12) United States Patent
D'Souza et al.

(10) Patent No.: US 12,355,441 B2
(45) Date of Patent: Jul. 8, 2025

(54) LEVEL-SHIFTER AND ITS USE WITH SWITCHING CONVERTERS

(71) Applicant: Shaoxing Yuanfang Semiconductor Co., Ltd., Shaoxing (CN)

(72) Inventors: Arnold J D'Souza, Bangalore (IN); Shyam Somayajula, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 317 days.

(21) Appl. No.: 18/161,103

(22) Filed: Jan. 30, 2023

(65) Prior Publication Data

US 2024/0128977 A1  Apr. 18, 2024

(30) Foreign Application Priority Data

Oct. 14, 2022  (IN) .............................. 202241058842

(51) Int. Cl.
| | |
|---|---|
| *H03K 19/0185* | (2006.01) |
| *H02M 1/08* | (2006.01) |
| *H02M 3/155* | (2006.01) |
| *H03K 3/037* | (2006.01) |
| *H03K 17/687* | (2006.01) |
| *H03K 19/20* | (2006.01) |

(52) U.S. Cl.
CPC ........ *H03K 19/01855* (2013.01); *H02M 1/08* (2013.01); *H02M 3/155* (2013.01); *H03K 3/037* (2013.01); *H03K 17/687* (2013.01); *H03K 19/20* (2013.01); *H03K 2217/0063* (2013.01); *H03K 2217/0072* (2013.01)

(58) Field of Classification Search
CPC .. H03K 19/01855; H03K 19/20; H03K 3/037; H03K 17/687; H03K 2217/0063; H03K 2217/0072; H02M 1/08; H02M 3/155
USPC ........................................................ 323/282
See application file for complete search history.

(56) References Cited

U.S. PATENT DOCUMENTS

| | | | |
|---|---|---|---|
| 7,463,071 B2 | 12/2008 | Ribarich | |
| 7,902,870 B1 | 3/2011 | Jiang | |
| (Continued) | | | |

OTHER PUBLICATIONS

What is the level-shift driver in high voltage IPDs, Nov. 3, 2022, 02 pages.

(Continued)

*Primary Examiner* — Yemane Mehari
(74) *Attorney, Agent, or Firm* — IPHORIZONS PLLC; Narendra Reddy Thappeta

(57) ABSTRACT

Aspects of the present disclosure provide level-shifters and their use with switching converters. A level-shifter receives a binary signal on an input node and generates an output signal also representing the same logic level of the binary signal. The output signal represents logic levels in a first voltage range defined with respect to a first constant reference potential in a sequence of first phases of a clock signal and in a second voltage range defined with respect to a second constant reference potential in a sequence of second phases of the clock signal. The first constant reference potential is lower than the second constant reference potential. A controller block contained in the level-shifter receives the binary signal and transfers a changed logic level of the binary signal only in the first phase, but not in the second phase of the clock signal.

20 Claims, 7 Drawing Sheets

(56) References Cited

U.S. PATENT DOCUMENTS

| | | | | |
|---|---|---|---|---|
| 2003/0058023 A1* | 3/2003 | Aoki | ............... | H03K 19/01728 |
| | | | | 327/333 |
| 2010/0102870 A1* | 4/2010 | Seedher | ............... | H03K 17/162 |
| | | | | 327/427 |
| 2011/0018588 A1* | 1/2011 | Notman | ............... | H02M 3/1588 |
| | | | | 327/87 |
| 2019/0103871 A1* | 4/2019 | Hidaka | ............ | H03K 19/00315 |

OTHER PUBLICATIONS

Laszlo Balogh, Fundamentals of MOSFET and IGBT Gate Driver Circuits, Oct. 2018, 48 pages, Texas.

Qiang Li, et al, A Novel Floating High-Voltage Level Shifter with Pre-Storage Technique, Feb. 24, 2022, 16 pages, MDPI, Basel, Switzerland.

Zekun Zhou, et al, A Fully Integrated Floating Gate Driver with Adaptive Gate Drive Technique for High-Voltage Applications, Aug. 5-8, 2018, 4 pages, IEEE, Windsor, ON, Canada.

LMG1210 200-V, 1.5-A, 3-A half-bridge MOSFET and GaN FET driver with adjustable dead time for applications up to 50 MHz, Jan. 2019, 30 pages, Texas.

High-Frequency, High Side and Low Side Gate Driver IC, Apr. 2019, 14 pages, USA.

Dawei Liu, et al., A New Design Technique for Sub-Nanosecond Delay and 200 V/ns Power Supply Slew-Tolerant Floating Voltage Level Shifters for GaN SMPS, IEEE Transactions on Circuits and Systems-I: Regular Papers, Nov. 14, 2018, 12 Pages, vol. 66, Issue No. 3, IEEE.

Yan-Ming Li, et al., A High Speed and Power-Efficient Level Shifter for High Voltage Buck Converter Drivers, 2010 10th IEEE International Conference on Solid-State and Integrated Circuit Technology, Date of Conference: Nov. 1-4, 2010, 03 Pages, IEEE.

Xin Ming, et al., A High-Voltage Half-Bridge Gate Drive Circuit for GaN Devices with High-Speed Low-Power and High-Noise-Immunity Level Shifter, proceedings of the 30th International Symposium on Power Semiconductor Devices & IC, May 13-17, 2018, pp. 355-358, Chicago, USA.

Jodie Buyle, et al., A new type of level-shifter for n-type high side switches used in high-voltage switching ADSL line-drivers, 2008 15th IEEE International Conference on Electronics, Circuits and Systems, Date of Conference: Aug. 31, 2008-Sep. 3, 2008, pp. 954-957, IEEE.

Hyunggun Ma, et al., Instantaneous Power Consuming Level Shifter for Improving Power Conversion Efficiency of Buck Converter, IEEE Transactions on Circuits and Systems—II, Jul. 2019, pp. 1207-1211, vol. 66, No. 7.

Dawei Liu, et al., Design of 370 ps Delay Floating Voltage Level Shifters with 30 V/ns Power Supply Slew Tolerance, IEEE Transactions on Circuits and Systems II: Express Briefs, Date of Publication: Feb. 18, 2016, 5 pages, vol. 63, Issue: 7, IEEE.

Hao-Yen Tang, High Voltage Level-Shifter Circuit Design for Efficiently High Voltage Transducer Driving, https://www2.eecs.berkeley.edu/Pubs/TechRpts/2014/EECS-2014-203.pdf, Dec. 1, 2014, 08 Pages.

* cited by examiner

LEVEL-SHIFTER AND ITS USE WITH SWITCHING CONVERTERS

PRIORITY CLAIM

The instant patent application is related to and claims priority from the co-pending provisional India patent application entitled, "Level Shifter", Serial No.: 202241058842, Filed: 14 Oct. 2022, which is incorporated in its entirety herewith to the extent not inconsistent with the description herein.

BACKGROUND

Technical Field

Embodiments of the present disclosure relate generally to level-shifters, and more specifically to level-shifters and their use with switching converters.

Related Art

Level-shifters convert/translate digital signals from one voltage level to another, and are employed in circuits containing components with varying voltage requirements, as is well known in the relevant arts. Level-shifters are used in circuits such as op-amps, SD cards, etc. which in turn are used in devices such as computers and mobile phones, as is also well known in the relevant arts.

Level-shifters are also used in switching converters. Switching converter refers to a component which generates a regulated DC (direct current) voltage from an input supply voltage by employing and operating one or more switches, as is well known in the relevant arts.

Several aspects of the present disclosure are directed to level-shifter and its use with switching converters.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
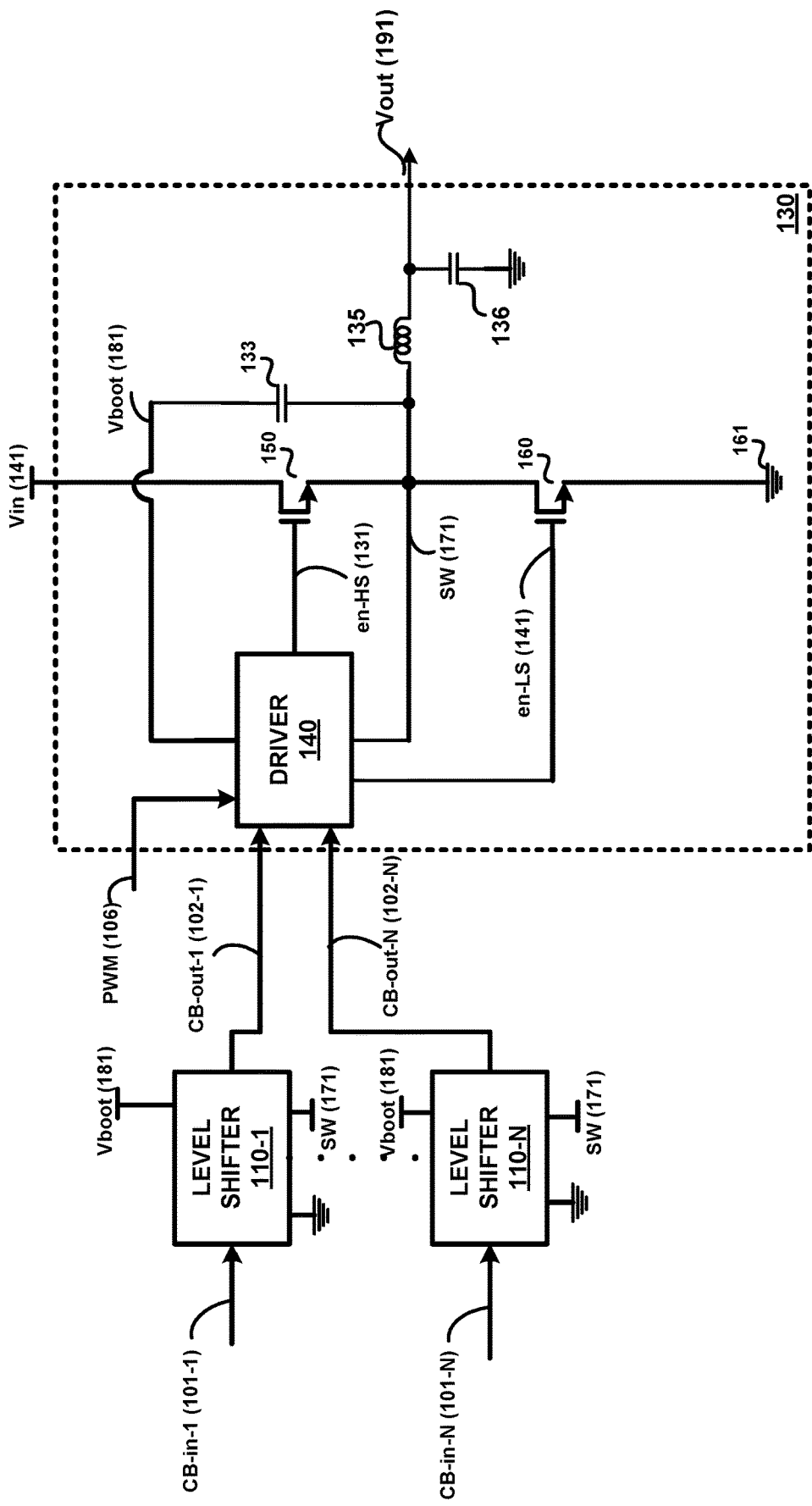
FIG. 1 is a block diagram of an example environment in which several aspects of the present disclosure can be implemented.

Aspects of the present disclosure provide level-shifters and their use with switching converters. A level-shifter receives a binary signal on an input node and generates an output signal also representing the same logic level of the binary signal. The output signal represents logic levels in a first voltage range defined with respect to a first constant reference potential in a sequence of first phases of a clock signal and in a second voltage range defined with respect to a second constant reference potential in a sequence of second phases of the clock signal. The first constant reference potential is lower than the second constant reference potential. A controller block contained in the level-shifter receives the binary signal and transfers a changed logic level of the binary signal only in the first phase, but not in the second phase of the clock signal. By preventing transfer in the second phase of the clock signal, potential damage to some of the components of the level-shifter may be avoided.

According to another aspect of the present disclosure, a level-shifter contains a latch having a first node and a second node, the nodes together providing a pair of complementary binary values, with the second node providing the output signal. The level-shifter also contains a first transistor having a first current terminal coupled to the first node and a second current terminal coupled to the first constant reference potential, and a second transistor having a first current terminal coupled to the second node and a second current terminal coupled to the first constant reference potential.

According to yet another aspect of the present disclosure, each of the first voltage range and the second voltage range is defined with respect to a higher voltage value and a lower voltage value. The first constant reference potential represents the lower voltage value of the first voltage range, and the second constant reference potential represents the lower voltage value of the second voltage range.

According to one more another aspect of the present disclosure, a controller block is configured to receive the binary signal and an enable signal, the enable signal indicating whether the clock signal is in the first phase or the second phase, with the controller block operating to transfer any changes in logic level of the binary signal only when the enable signal indicates that the clock signal is in the first phase.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Environment

FIG. 1 is a block diagram of an example environment in which several aspects of the present disclosure can be implemented. FIG. 1 is shown containing level-shifters 110-1 through 110-N (N being a positive integer) and a portion of a smart power stage (SPS) 130. As an example, the portion shown in FIG. 1 corresponds to an SPS of a voltage regulator module (VRM) that generates one or more supply voltages, only one (Vout) of which is the output of SPS 130. Various control loops that operate in conjunction with SPS 130 to generate Vout may be implemented in a phase controller of the VRM, an example of which is shown and described below with reference to FIG. 5. However, various aspects of the present disclosure can be implemented in a stand-alone switching converter also, as would be obvious to a skilled practitioner upon reading the disclosure herein. Further, only those portions of SPS 130 that are relevant for an understanding of the various aspects of the present disclosure are shown and described. SPS 130 may contain more or fewer circuits or blocks. Furthermore, although level-shifters are shown external to SPS 130, the level-shifters implemented according aspects of the present disclosure can be contained within SPS 130. The combination of the level-shifter and the SPS is implemented in integrated circuit (IC) form in an embodiment.

SPS 130 in turn is shown containing driver 140, high-side (HS) switch 150, low-side (LS) switch 160 (which can instead be replaced by a diode also in some switching converter types, as is well known), bootstrap capacitor 133, inductor 135 and output capacitor 136. It is noted that details of SPS 130 as relevant to the disclosure have been provided and described herein. However, it is to be understood that in alternative embodiments, SPS 130 may be implemented differently, using more or fewer components and circuitry. Although level-shifters 110 are shown external to SPS 130, in alternative embodiments, level-shifters 110 may be internal to SPS 130. Although each level-shifter 110 is shown as transferring a respective configuration bit, in alternative embodiments, a single level-shifter that receives multiple configuration bits may be employed, with corresponding changes to the circuit of FIG. 1, as will be apparent to a skilled practitioner by reading the disclosure herein. The level-shifters will individually or collectively be referred by reference number 110, as will be clear from the context. Similar convention is employed for the respective associated signals also.

SPS 130 receives input voltage Vin (141) from a power source. Vin is shown connected to HS switch 150. SPS 130 generates regulated output voltage Vout on path 191. Typical value of Vin is about 22 volts (V). Signal PWM (106) is an input to SPS 130 and is a pulse-width modulated (PWM) signal, which may, for example, be a signal of a fixed frequency but variable duty-cycle, and whose frequency is potentially modifiable by phase controller 210 (not shown in FIG. 1) based on load-current demands. The PWM signal controls the opening and closing of HS switch 150 and LS switch 160 of SPS 130. The duty cycle of PWM signal (106) may be set by a phase controller (not shown in FIG. 1) and is designed to generate the desired regulated output voltage Vout. SPS 130.

Driver 140 internally contains multiple HS and LS drive circuits to respectively generate drive signals en-HS (131) and en-LS (141). Each drive circuit of the multiple drive circuits is designed to generate the corresponding drive signal with a corresponding edge-rate or strength (for example, fast/medium/slow). Configuration bits 102 specify which ones of each of the multiple HS and LS drive circuits is to be activated and used, thus adjusting the rate at which the HS and LS switches are turned OFF/ON, typically in response to temperature, supply voltage and process corners of the IC (integrated circuit). Driver 140 activates the corresponding drive circuits indicated by the configuration bits, and causes the respective drive signals to be generated in response to the logic level of PWM (106).

HS switch 150 and LS switch 160 are each shown implemented as an n-channel MOSFET (Metal Oxide Semiconductor Field Effect Transistor) with driver 140 driving the gate terminals of the MOSFETs, although the switches may be implemented differently in alternative embodiments. Although driver 140 is shown generating drive signals en-LS (141) and en-HS (131) for HS switch 150 and LS switch 160 respectively, in alternative embodiments, there may be separate driver blocks for generating the respective drive signals for HS switch 150 and LS switch 160.

When PWM (106) is a logic HIGH, driver 140 generates respective appropriate voltages on paths 131 (en-HS) and 141 (en-LS) to switch ON HS switch 150 and switch OFF LS switch 160. When PWM (106) is a logic LOW, driver 140 generates respective appropriate voltages on paths 131 and 141 to switch OFF HS switch 150 and switch ON LS switch 160. Accordingly, voltage at SW node (171) is pulled down to ground (161) when LS switch 160 is ON, and is pulled up to Vin (141) when HS switch 150 is ON. Thus, PWM (106) operates as a clock signal containing sequences of two phases—one in which LS switch 160 is ON (and HS switch 150 is OFF), and another phase in which LS switch 160 is OFF (and HS switch 150 is ON). Accordingly, PWM signal (106) is alternatively referred to as 'clock signal' herein.

As is well known in the relevant arts, a bootstrap capacitor (such as bootstrap capacitor 133) is employed to drive HS switch 150 with a very low ON-resistance, when HS switch 150 is implemented using an n-type MOSFET (NMOS). Specifically, the gate terminal of HS switch 150 needs to be driven to a voltage whose magnitude is sufficiently higher than Vin (141) in order to drive HS switch ON with a very low ON-resistance. This is needed since as HS switch starts turning ON, LS switch 160 has already been switched OFF, the voltage at node SW (171) starts increasing towards Vin, and eventually equals Vin (which may be, for example, 22 Volts or so). Therefore, the gate voltage of HS switch 150 may need to be at a minimum of Vin+Vth1 (Vth1 being threshold voltage of HS switch/MOSFET). To turn HS switch fully ON (so that it has a very low ON-resistance), the gate voltage may need to be sufficiently higher than (Vin+Vth1), and such higher voltage is denoted herein by (Vin+Vth1+Vgs-delta). Bootstrap capacitor is charged at the beginning of operation of SPS 130 to a voltage that is equal to or greater than (Vth1+Vgs-delta).

The power supply and ground nodes of driver 140 (and therefore of circuits within driver 140) are Vboot (181) and SW (171) respectively. The voltage levels of Vboot and SW are not fixed but change during operation of SPS 130, as is well known in the relevant arts. Due to initial charging of bootstrap capacitor 133 to at least (Vth1+Vgs-delta) as noted above, the movement of node SW (which is connected to source terminal of HS switch 150) from 0V (ground 161) to Vin raises Vboot from (Vth1+Vgs-delta) to (Vin+Vth1+Vgs-delta), thereby enabling HS switch 150 to be fully ON. As an illustrative example, if Vin is 22V and the voltage across capacitor 133 is 3.3V, the voltages at boot node (Vboot, 181) and SW node (171) respectively have the following values based on state of HS switch 150 and LS switch 160:

When HS switch 150 is ON and LS switch 160 is OFF:
Vboot (181)=SW(171)+(voltage across bootstrap capacitor 133)=22+3.3=25.3; SW (171)=22V When HS switch 150 is OFF and LS switch 160 is ON:
Vboot (181)=SW(171)+(voltage across bootstrap capacitor 133)=3.3V, SW (171)=0V.

It may accordingly be noted that driver 140 operates in each of a first voltage range (25.3V-22V) and a second voltage range (3.3V-0V), based on state of HS switch 150 and LS switch 160. Furthermore, driver 140 traverses through voltages (although only for very brief intervals) between the two voltage ranges when moving from one voltage range to the other. Each of the two voltage ranges noted above is defined by a higher voltage value and a lower voltage value, and the convention of (higher voltage value-lower voltage value) is followed throughout in this disclosure to define a voltage range. The configuration bits received by driver 140 on path 102 therefore need to have logic levels in the corresponding voltage range in which driver 140 is operating at the time they are transferred to driver 140. In other words, when driver 140 is operating in the first voltage range (25.3V-22V), logic HIGHs and logic LOWs of configuration bits 102 would need to be consistent with the first voltage range, and thus respectively within the Voh-min (minimum output HIGH voltage) and Vol-max (maximum output LOW voltage) required by driver 140 when in the first voltage range. As an example, a logic HIGH voltage of around 25.3V and a logic LOW voltage of around 22V would be required for the configuration bits for reliable transfer to driver 140.

However, the configuration bits received on paths 101 may always be in the lower voltage range (3.3V-0V), according to input-logic voltage specifications of SPS 130. Therefore, level shifting of the voltage levels of configuration bits may be necessary for reliable transfer to driver 140. Such level shifting is performed by level-shifters 110-1 through 110-N.

Each level-shifter 110 is shown as receiving a respective configuration bit on path 101 and transferring the configuration bit on path 102 to driver 140. In other words, level-shifter 110 generates an output signal (102) also representing the same logic level of the configuration bit (101). Thus, level-shifter 110-1 is shown receiving configuration bit CB-in-1 on path 101-1, and transferring the configuration bit to driver 140 on path 102-1. Each level-shifter 110 receives input signals in a fixed voltage range (3.3V-0V in the example used herein), and needs to provide output signals 102 in a different voltage range (25.3V-22V in the example used herein, but in general in the non-fixed voltage range Vboot-SW).

It is noted here that the specific voltage ranges noted above are provided merely for illustration. Each voltage range can however have the lower and higher voltages each different from that noted above.

Several features of the present disclosure would be better understood and appreciated when compared with conventional techniques for level shifting. Accordingly, an example prior level-shifter is briefly described next with respect to FIG. 2.

Figure 2:
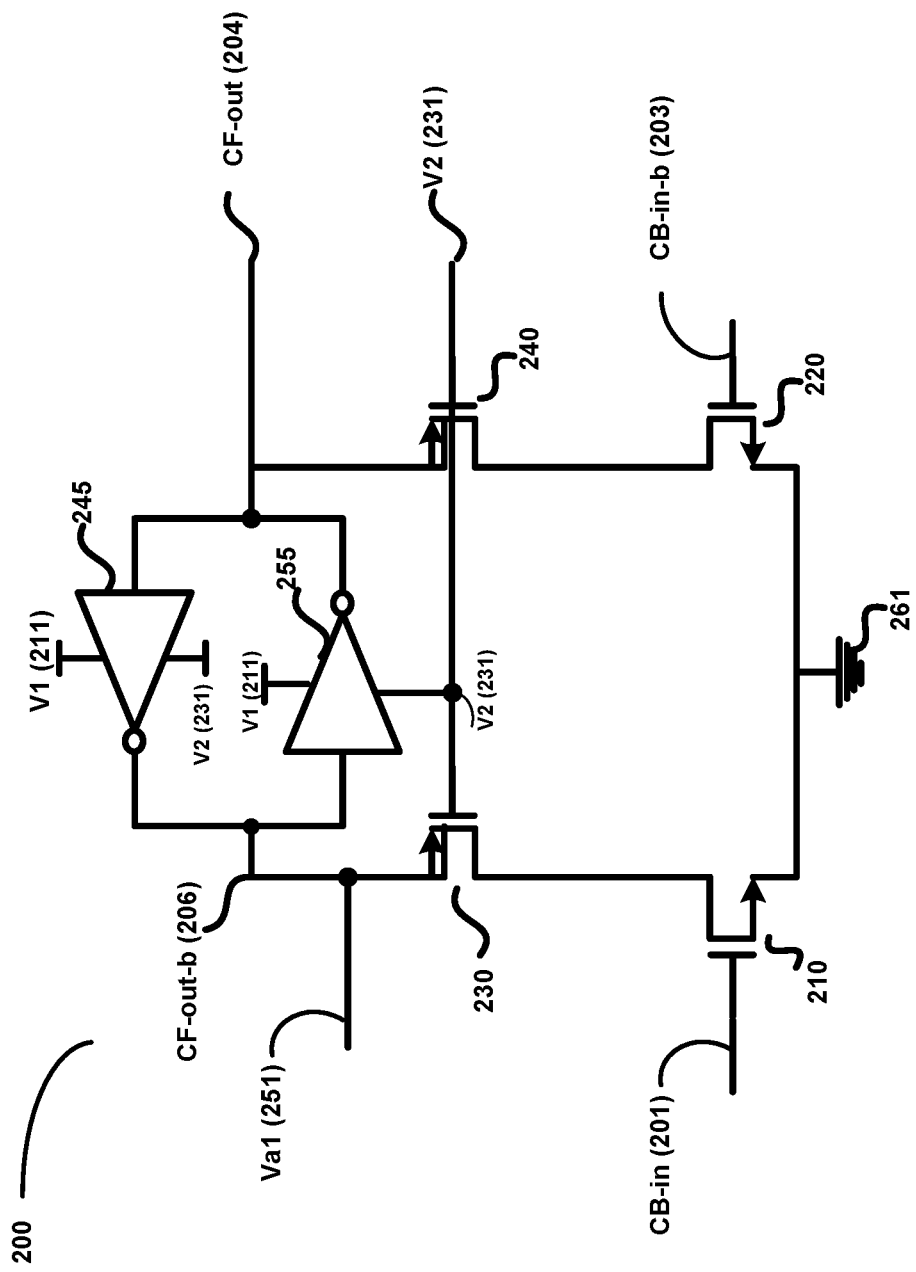
FIG. 2 illustrates level shifting in a prior technique.

FIG. 2 is a block diagram illustrating level shifting in a prior technique. Level-shifter 200 depicted in FIG. 2 is shown containing high-voltage (HV) switches 210, 220, 230 and 240, and inverters 245 and 255. As is well known in the relevant arts, a high-voltage switch refers to a switch that has high breakdown voltage characteristics, typically the maximum Vds (drain-to-source voltage) that the MOSFET can safely handle without going into break-down. The maximum Vds can be of the order of tens or hundreds of Volts, depending on the specific application in which the switch is employed. In the embodiments described herein, the term high-voltage switch generally refers to a transistor (e.g., MOSFET) with a maximum Vds rating that is much larger (say 1.5-2 times or greater) then the Vds ratings of the transistors used in inverters of a level-shifter, as well as the transistors used in circuits contained in driver 140. In the examples provided herein, it is assumed that the transistors in inverters and in level-shifters are 3.3V-5V devices (i.e., designed to handle Vds not exceeding 5V), and the high-voltage transistors have a maximum voltage rating of 27V-30V.

Level-shifter 200 receives complementary values of configuration bit on respective paths 201 (CB-in) and 203 (CB-in-b). The voltage levels of the configuration bits are in a first voltage range (or voltage domain), for example, 3.3V-0V. High-voltage switches 210 and 220 are shown implemented as n-type MOSFETs, while high-voltage switches 230 and 240 are shown implemented as p-type MOSFETs. Drain terminal of MOSFET 210 is shown connected to drain terminal of MOSFET 230, while drain terminal of MOSFET 220 is shown connected to drain terminal of MOSFET 240.

Inverters 245 and 255 are shown with the output terminal of each being connected to the input terminal of the other, thereby forming a latch. Signals CF-out (204) and CF-out-b (206) represent complementary logic values and are the Q and Q-bar outputs of the latch. Each inverter 245 and 255 is shown as operating in voltage range V1 (211)-V2 (231) (which may, for example, be 25.3V-22V).

In operation, when the two voltage domains are the same (i.e., V1 and V2 have voltages that respectively substantially equal the supply and ground voltages of circuits generating the configuration bits), a logic HIGH value of a configuration bit received by the switches 210 and 230 causes the corresponding pair of HV transistors (210 and 230 or 220 and 240) to be ON, and can thereby change the logic state of the latch.

When the two voltage domains are different (e.g., V1 and V2 are 25.3 and 22V respectively, and the configuration bits are generated in the voltage range 3.3V-0V), HV PMOS transistors isolate the latches 245 and 255 from system ground (0V), thereby ensuring that the latches are not subjected to voltages beyond their maximum ratings. For example, assuming the latch output 206 is a logic HIGH, the logic state of the latch can be changed by changing output 206 to logic LOW by turning ON switch 210. Correspondingly, level-shifter 200 receives a logic HIGH on path 201 and switch 210 is turned ON. Switch 230 is also ON due to the logic HIGH at node 206. With both transistors 210 and 230 ON, node 206 attempts to change to 0V. However, voltage 206 can go no lower than the threshold voltage (Vthp) of PMOS 230, since any further fall would switch OFF PMOS 230 and pull node 206 back to V1 (assuming the logic change has not yet taken place). Thus, voltage at CF-out-b (206) changes to logic LOW (having a voltage level equal to V2+Vthp). Accordingly, voltage at CF-out (204) would be a logic HIGH (having voltage level substantially equal to V1, 211). Level-shifter 200 receives the complementary value (logic LOW) on path 203, and thus switches 220 and 240 are turned OFF.

Due to the voltage clamping noted above, inverters 245 and 255 are protected from exceeding their maximum voltage rating. In the absence of switch 230, voltage Val (251) may be pulled to ground (261, equal to 0V) when switch 210 turns ON, thus causing the output circuitry of inverter 245 to be stressed beyond its maximum of 3.3V/5V rating.

However, one of the drawbacks of prior level-shifter 200 is a large die area (in the IC) in order to support the high-voltage rating. Another problem is an increase in die area due to the requirement of separate/isolated locally-tied source-to-substrate connections needed for PMOS transistors 230 and 240. Furthermore, as the number of configuration bits increases, the number of level-shifters such as 200 increases, with each level-shifter requiring four HV switches.

A level-shifter implemented according to several aspects of the present disclosure overcomes the drawbacks noted above, as described in detail below with respect to example embodiments.

3. Level-Shifter

Figure 3A:
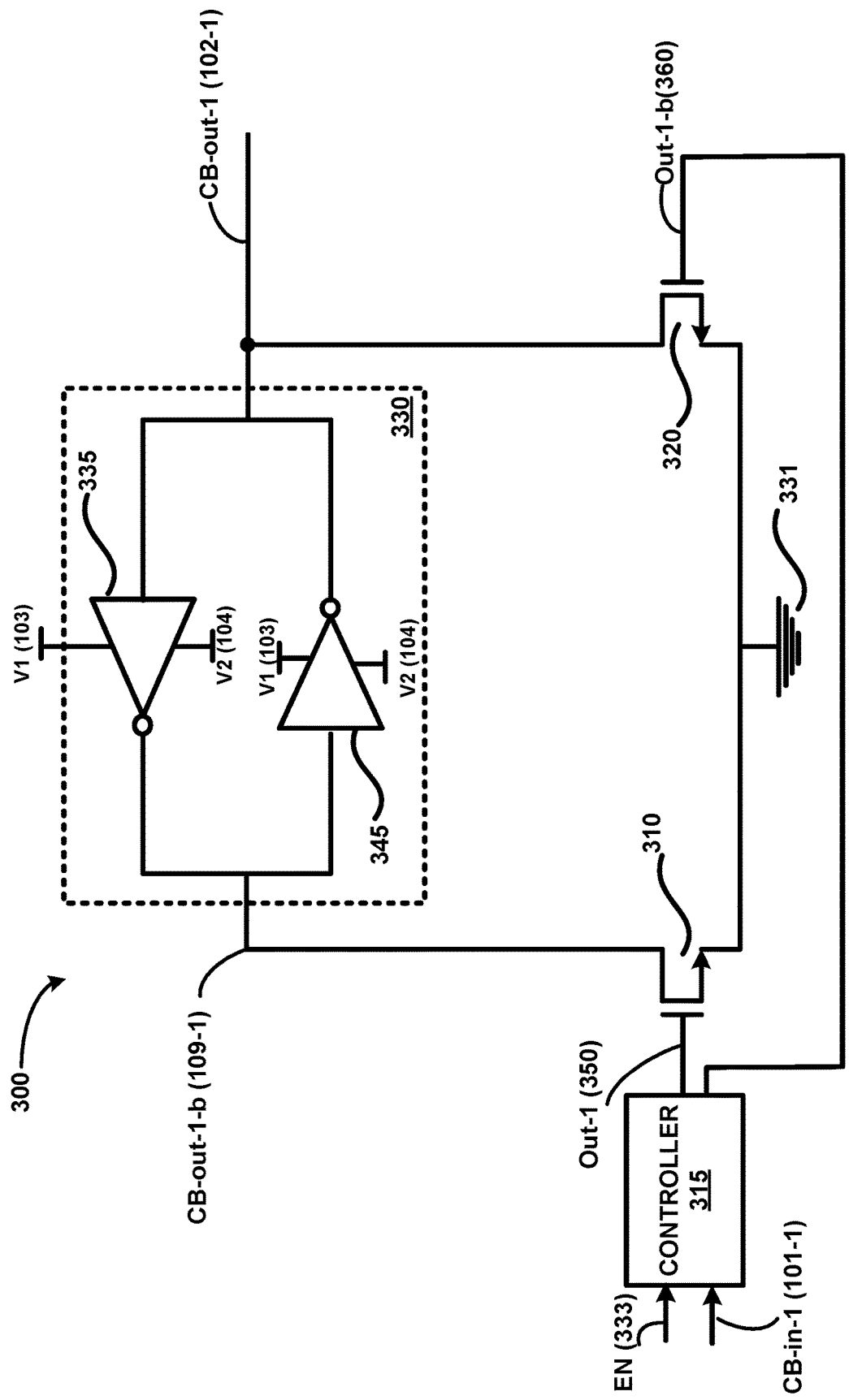
FIG. 3A is a block diagram illustrating the implementation details of a generic level-shifter in an embodiment of the present disclosure.

FIG. 3A is a block diagram of a level-shifter implemented according to several aspects of the present disclosure, in an embodiment. Level-shifter 300, which may be implemented in place of level-shifter 110 (for example, 110-1) of FIG. 1, is shown containing controller 315, HV NMOS switches 310 and 320, and latch 330. Latch 330 in turn is shown containing inverters 335 and 345, with output of each connected to the input of the other. Latch 330 may internally contain weak pull-up/pull-down resistors (not shown) to enable change of state of latch 330 by pulling the corresponding output node to ground via HV switches 310 or 320. The specific lower and upper voltage limits of the voltage ranges noted below are provided merely by way of example, but the lower and upper limits for a voltage range can have other values also. Level-shifter 300 operates to transfer input (configuration bit CB-in-1 in the illustrative embodiment) only in a particular phase (e.g., a first phase) of a clock signal (not shown in FIG. 3) but not in another phase (e.g., a second phase) of the clock signal. Each phase of the clock signal may be associated with a corresponding operational voltage range. An example of such clock signal may be PWM signal of a switching converter noted in FIG. 1.

Controller 315 receives configuration bit CB-in-1 on path 101-1 and enable signal (EN) on path 333. Signal EN (333) indicates whether the clock signal is in the first phase or in the second phase. In an embodiment, signal EN (333) is a logic HIGH when the clock signal is in the first phase and a logic LOW otherwise. Controller 315 internally generates the logic inverse of CB-in-1. Alternatively, both the configuration bit and its logical inverse can be received from the circuit (not shown, but which may, for example, be a phase controller of a VRM or a user input) that generates the configuration bit. Controller block 315 operates to transfer any changes in logic level of input (configuration bit, 101-1) only when signal EN (333) indicates that the clock signal (noted above) is in the first phase.

Gate terminal of MOSFET 310 is shown receiving signal Out-1 on path 350, while gate terminal of MOSFET 320 is shown receiving signal Out-1-b on path 360. Source terminals of MOSFETs 310 and 320 are shown connected to reference potential (e.g., ground/0V) 331. Drain terminal of MOSFET 310 is shown directly connected to input/output node CB-out-1-b (109-1) of latch 330, while drain terminal of MOSFET 320 is shown directly connected to input/output node CB-out-1 (102-1) of latch 330. As shown in FIG. 3A, a "direct connection" between two nodes means that the connecting path offers a low impedance, presented only by the connecting wire (and any imperfections thereof), without any intended components provided in between the two nodes.

According to an aspect of the present disclosure, a change of logic state of latch 330 is performed only when EN (333) is a logic HIGH. Controller 315 performs a logical AND operation of CB-in-1 and EN (333) to generate signal Out-1 (350), and a logical AND operation of the logical inverse of CB-in-1 and EN (333) to generate signal Out-1-b (360).

Due to the use of signal EN (333), a change of logic state of latch 330 is performed only the clock signal is in the first phase but not in the second phase. Due to such operation, components inside latch 330 are not subjected to voltages that exceed the maximum ratings for the components in latch 330. It is noted here that instead of the AND operation, other techniques/circuits can also be used to ensure change of state of latch 330 only when EN is a logic HIGH, as would be obvious to one skilled in the relevant arts.

Figure 3B:
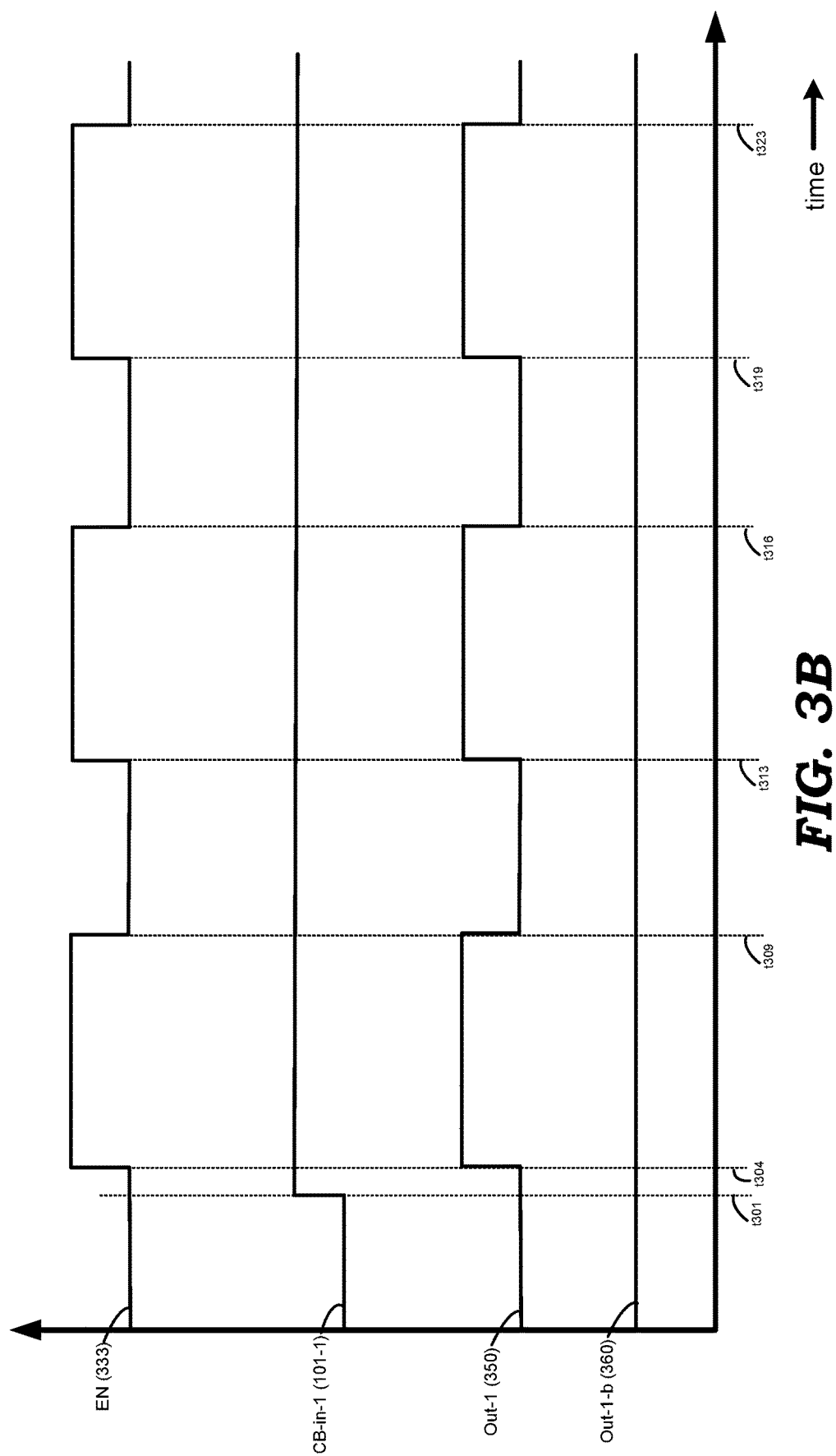
FIG. 3B is a timing diagram illustrating the operations of level-shifter when a logic level is used to write a configuration bit, in an embodiment of the present disclosure.

When EN (333) is a logic LOW, latch 330 retains its previous logic state (the state of signals CB-out-1-b (109-1) and CB-out-1 (102-1) brought about by the last change effected). If CB-in-1 is a logic HIGH, controller 315 generates a logic HIGH on path 350, which causes node 109-1 to be pulled to 0V (i.e., logic LOW), and consequently node 102-1 switches to about 3.3V (logic HIGH). If CB-in-1 is a logic LOW, controller 315 generates a logic HIGH on path 360, to cause the output CB-out-1 (102-1) to switch to logic LOW. FIG. 3B is a timing diagram (not to scale) illustrating the operations of level-shifter 300 noted above.

FIG. 3B shows example waveforms of signals EN (333), configuration bit CB-in-1 (101-1), Out-1 (350) and Out-1-b (360), in an example embodiment. At t301, a logic HIGH is received on path CB-in-1 (101-1). However, since EN (333) is at logic LOW at t301, Out-1 (350) continues to be in its previous state (logic LOW). At t304, EN (333) goes to logic HIGH, indicating that the voltage range in which the circuitry (not shown) that generates configuration bit CB-in-1 is the same as that in which latch 330 is (currently) operating in. Accordingly, at t304, Out-1 (350) goes to logic HIGH (switching ON transistor 310, thus causing change of logic state of latch 330) while Out-1-b (360) is at logic LOW (transistor 320 is OFF). Out-1 (350) remains at logic HIGH for as long as signal EN (333) is a logic HIGH, i.e., in the interval t304-t309. Out-1 (350) is goes to logic HIGH every time EN (333) goes to logic HIGH (i.e., in time intervals t313-t316 and t319-t323). In other words, transistor 310 is switched ON every time EN (333) equals logic HIGH.

In an alternative embodiment, controller 315 causes the writing of a configuration bit into latch 330 (i.e., to cause change of logic state of latch 330) of level-shifter 300 by applying a pulse to the gate of the corresponding transistor 310 or 320 when EN (333) is at logic HIGH. In such an embodiment, upon receipt of configuration bit CB-in-1 (101-1), controller 315 waits for EN (333) to switch to logic HIGH, and in the logic HIGH interval of EN (333), generates a pulse on the corresponding path 350 (if CB-in-1 is a logic HIGH) or 360 (if CB-in-1 is a logic LOW) to write logic HIGH or logic LOW respectively on node 102-1. Compared to the operations illustrated in FIG. 3B, the corresponding transistor is switched ON only once for writing a configuration bit. On the other hand, in the technique illustrated in FIG. 3B, the corresponding transistor is switched ON every time EN (333) equals logic HIGH. Typically, a configuration bit changes only very infrequently.

Figure 3C:
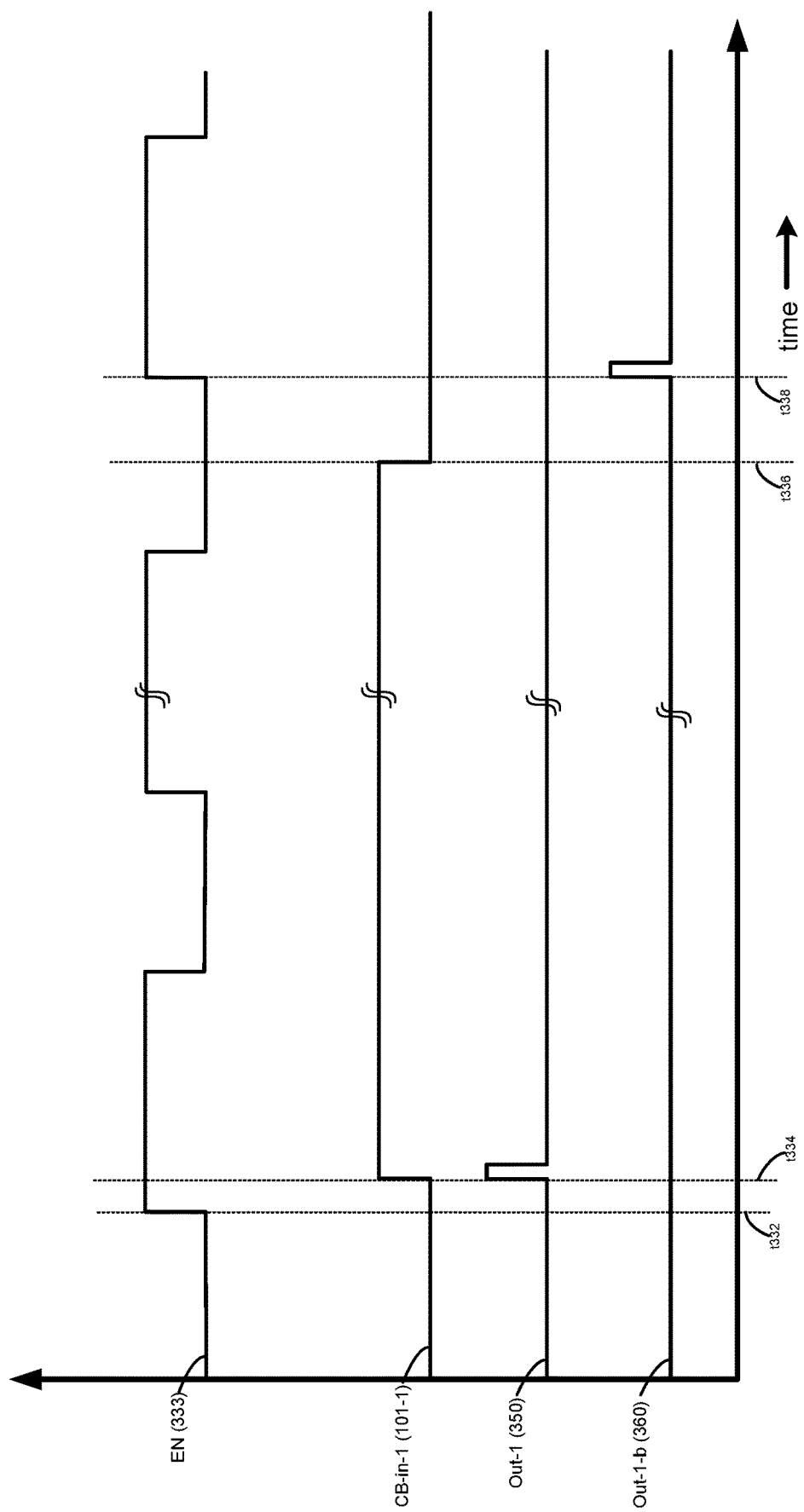
FIG. 3C is a timing diagram illustrating the operations of level-shifter when a pulse is used to write a configuration bit, in an embodiment of the present disclosure.

FIG. 3C is a timing diagram (not to scale) illustrating the operations of level-shifter 300 when a pulse rather than a logic level is used to write the configuration bit. FIG. 3C shows example waveforms of signals EN (333), configuration bit CB-in-1 (101-1), Out-1 (350) and Out-b (360). At t332, EN (333) goes HIGH. At t334, a logic HIGH is received on path CB-in-1 (101-1). Since EN (333) is a logic HIGH, controller 315 generates a pulse on the path 350

(Out-1) at t334 (briefly switching ON transistor 310, thus causing change of logic state of latch 330), while Out-1-*b* (360) is a logic LOW (transistor 320 is OFF). At t336, a logic LOW is received on path CB-in-1 (101-1). The logic state of latch 330 is not changed at t336 since EN (333) is at logic LOW. At t338, EN (333) goes to logic HIGH. Accordingly, controller 315 generates a pulse on path 360 (Out-1-*b*) (briefly switching ON transistor 320, thus causing change of logic state of latch 330) and a logic LOW on path 350 (Out-1) (transistor 310 is OFF).

Thus, based on the values of EN (333) and the configuration bit (CB-in-1, 101-1), the corresponding one of HV switches 310 and 320 would be switched ON for a corresponding duration, thereby changing the logic state of latch 330, and the new value of the configuration bit is latched and provided to an external circuit (like a driver of switches in an SPS/switching regulator).

When the voltage range V2-V1 changes (as in the SPS of FIG. 1, with the voltage difference V1-V2 remaining the same), EN (333) would be a logic LOW thereby maintaining each of HV switches 310 and 320 in an OFF state. As a result, components in latch 330 are not subjected to voltages beyond the maximum rated voltage. At higher voltages of V1 and V2, each of switches 310 and 320 would be OFF, but may be subjected to a higher voltage difference between source and drain, and therefore need to be implemented as HV switches that can handle the worst-case (highest) value of voltage difference V1-ground (331). As an illustrative example, each of inverters 335 and 345 of latch 330 may be designed to handle a maximum voltage rating of 3.3V to 5V.

It may be noted that although the logic state of each of signals 109 and 102 is retained, the voltage levels provided on paths 109 and 102 correspond to the voltage range that latch 330 is operating in. Thus, for example, if the logic state of latch has been changed such that CB-out-1 (102-1) is a logic HIGH (substantially equal to 3.3V), and thereafter, latch 330 begins to operate in voltage range (25.3V-22V), voltage level of CB-out-1 provided on path 102-1 will shift to 25.3V (corresponding to logic HIGH in voltage range 25.3V-22V) with respect to system ground 331 (0V).

Level-shifter 300 employs only two high-voltage switches (both NMOS in the example), and therefore can be implemented with fewer components, smaller area (smaller die area when implemented in an IC), while still allowing other components (e.g., latch 330) to be implemented as low-voltage devices. Controller 315 may be implemented in a known way.

The description is continued to illustrate the manner in which level-shifter 300 is used in an SPS or switching converter, in an embodiment of the present disclosure.

4. Level-Shifter Used with an SPS

Figure 4:
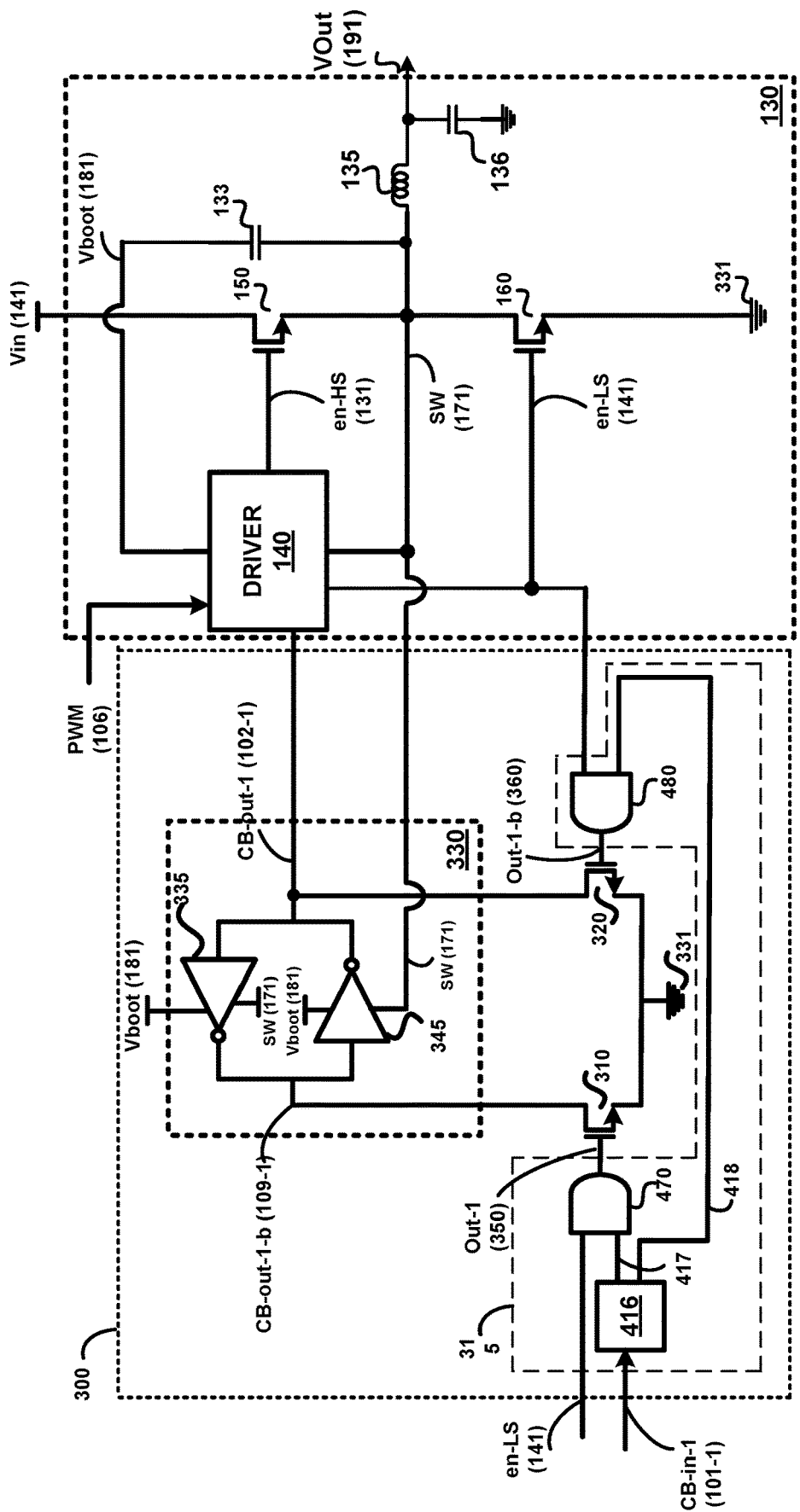
FIG. 4 is a block diagram illustrating a level-shifter particularly suited for use with a switching converter, in an embodiment of the present disclosure.

FIG. 4 is a block diagram illustrating the implementation of a level-shifter particularly suited for use with an SPS or a switching converter in general, in an embodiment of the present disclosure. FIG. 4 is shown containing level-shifter 300 (which may be implemented in place of level-shifter 110 (for example, 110-1) of FIG. 1) and SPS 130. The details of SPS 130 have been described in detail with reference to FIG. 1, and the description is not repeated here in the interest of brevity. In an embodiment, the combination of one or more instances of level-shifter 300 and SPS 130 is implemented in integrated circuit (IC) form.

The implementation details as well as the operation of level-shifter 300 and SPS 130 are as provided above, and the description is not repeated in the interest of conciseness. Only the additional details of controller 315 are provided here.

Latch 330 and driver 140 operate with the same power supply (Vboot, 181) and return (SW, 171). In the illustrative embodiment of FIG. 4, level-shifter 300 receives configuration bit (101-1) that has voltage levels in voltage range (3.3V-0V). Level-shifter 300 operates to store the configuration bit in latch 330, in the manner described above with respect to FIG. 3A. Level-shifter 300 provides the stored configuration bit to driver 140 via path 102-1. The additional implementation details of controller 315 in an embodiment are shown in FIG. 4 and described next.

Specifically, controller 315 is shown containing AND gates 470 and 480, and block 416. Block 416 is implemented in either of two ways. In one embodiment, block 416 generates a logic HIGH on path 417 (and logic LOW on path 418) when CB-in-1 (101-1) is a logic HIGH, and vice-versa. In an alternative embodiment, block 416 generates pulses on path 417 and 418. In such an embodiment, upon receipt of configuration bit CB-in-1 (101-1), block 416 generates a pulse on the corresponding path 417 (if CB-in-1 is a logic HIGH) or 418 (if CB-in-1 is a logic LOW). Block 416 may be implemented in a known way.

Signal en-LS (141) corresponds to signal EN (333) of FIG. 3A. Thus, a pulse is generated on path 350 when en-LS (141) is a logic HIGH and CB-in-1 (101-1) is a logic HIGH. It may be noted that en-LS (141) is a logic HIGH when driver 140 is operating in voltage range (3.3V-0V), i.e., LS switch 160 is ON (and HS switch 150 is OFF). Thus, a logic state of latch 330 is changed when driver 140 is operating in voltage range (3.3V-0V).

When driver 140 is operating in voltage range (25.3V-22V), en-LS is a logic LOW, i.e., LS switch 160 is OFF and HS switch 150 is ON. During this period, outputs of AND gates 470 and 480 are logic LOW. Thus, the previous logic state of latch 330 is retained when driver is operating in voltage range (25.3V-22V).

It may be appreciated that by restricting a change of logic state of latch 330 to the period when driver 140 is operating in a lower voltage range (3.3V-0V in the illustrative embodiment), components inside latch 330 are not subjected to voltages that exceed their corresponding maximum ratings.

Level-shifter 300 implemented as described above can be incorporated in a larger device or system as described briefly next.

5. System

Figure 5:
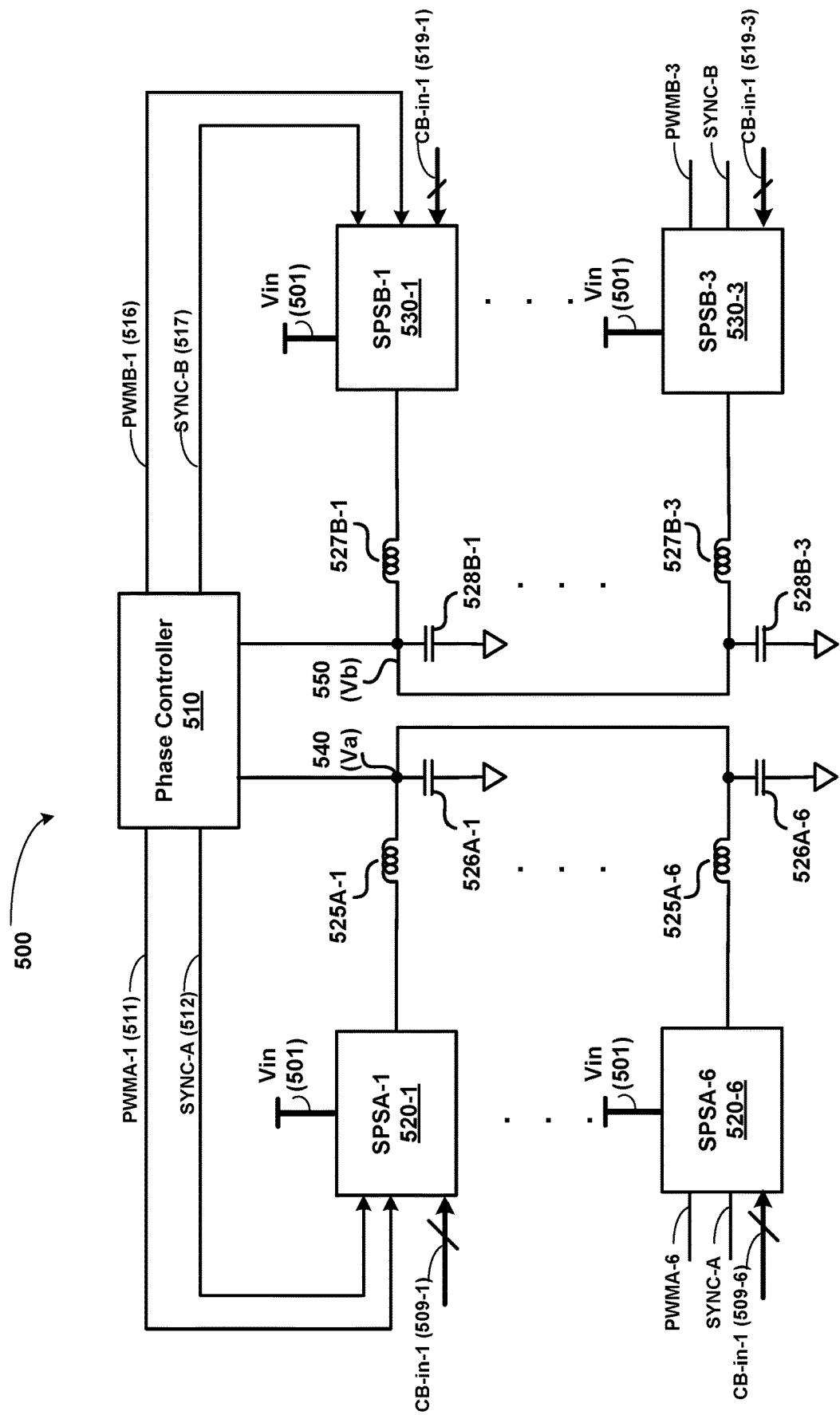
FIG. 5 is a block diagram of a system in which a device implemented according to several aspects of the present disclosure can be incorporated, in an embodiment of the present disclosure.

FIG. 5 is a block diagram illustrating the implementation details of a system incorporating level-shifter 300 described in detail above, in an embodiment of the present disclosure. In the embodiment, system 500 is a VRM (Voltage Regulator Module), sometimes also called processor power module (PPM), and is shown containing two step-down switching (buck) converters to generate several smaller voltages from a higher-voltage supply source. In other embodiments however, other types of DC-DC converters such as boost, buck-boost, hysteretic converters etc., can be implemented instead of a buck converter.

Broadly, VRM 500 provides desired power supply voltages to devices such as computers, mobile phones, etc. With a VRM, multiple devices/ICs requiring different supply voltages can be mounted on the same platform, for example, a computer motherboard of a personal computer (PC). The specific components/blocks of VRM 500 are shown merely by way of illustration. However, typically VRM 500 may contain more components/blocks, such as maintenance and configuration blocks, etc., as is well known in the relevant arts.

VRM 500 is shown containing phase controller 510, smart power stage (SPS) SPSA-1 (520-1) through SPSA-6 (520-6), SPSB-1 (530-1) through SPSB-3 (530-3), inductors 525A-1 through 525A-6, and 527B-1 through 527B-3 and capacitors 526A-1 through 526A-6, and 528B-1 through 528B-3. Power supply Va (540) is generated by a 6-phase buck converter (there are six SPSes-520-1 through 520-6), while power supply Vb (550) is generated by a 3-phase buck converter (there are three SPSes-530-1 through 530-3).

Phase controller 510 performs regulating functions to enable the generation of regulated voltages Va (540) and Vb (550). Accordingly, Va and Vb are shown as being provided as inputs to phase controller 510, to enable operation of one or more feedback loops within phase controller 510 to regulate Va and Vb. Although not indicated in FIG. 5, phase controller 510 also receives inductor-current information (current flowing through each of the inductors) from each of the SPSes to enable various operations such as current-mode control of voltage regulation, current limiting, short circuit protection, and balancing the currents generated by each SPS of a same converter so as to make the currents from each SPS of a converter to be substantially equal in magnitude.

Each SPS may be implemented as SPS 130 shown in FIGS. 1 and 4, and contains a high-side switch, a low-side switch (or a diode instead), gate-drive circuitry (such as driver 140 shown in FIG. 4) for the two switches (but only the high-side switch when a diode is used instead of low-side switch), and one or more level-shifters 300. Each SPS receives a source of power as an input which is connected to the corresponding high-side switch (as shown in detail in FIGS. 1 and 4).

Each SPS communicates with phase controller 210 via corresponding signals PWM and SYNC. The specific communication signals between each SPS and phase controller 510 are shown merely by way of illustration. However, typically many more communication signals such as current sense, temperature values, etc., may be exchanged between each SPS and phase controller 510, as is well known in the relevant arts. Thus, SPSA-1 is shown connected to phase controller 510 through signal/paths PWMA-1 (511) and SYNC-A (512). SPSA-6 communicates with phase controller 510 via signals PWMA-6 and SYNC-A. Similarly, SPSB-1 is shown connected to phase controller 510 through signal/paths PWMB-1 (516) and SYNC-B (517). SPSB-3 communicates with phase controller 510 via signals PWMB-3 and SYNC-B. The other SPSes would have similar connections with phase controller 510.

Signal PWM is an input to an SPS and provides a pulse-width modulated (PWM) signal, corresponding to signal 106 depicted in FIG. 4. Each SPS may receive one or more configuration bits to control a mode of operation of the driver block (not shown in FIG. 5) contained inside the SPS. Thus, SPSA-1 (520-1) is shown receiving configuration bit(s) on path 509-1. Similarly, SPSB-1 (530-1) is shown receiving configuration bit(s) on path 519-1. Each SPS contains one or more level-shifters (implemented similar to level-shifter 300) to forward configuration bit(s) to the driver contained in the SPS.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

It may be noted that in the specification and in the claims, the phrase "connected to" means a direct connection such as electrical, mechanical, or magnetic connection between the components that are connected, without any intermediary devices or components. In other words, the impedance of the connection path between the two components is the only impedance present between the two components, such impedance typically being zero or very low. The phrase "coupled to" means a direct or an indirect connection, such as a direct electrical, mechanical, or magnetic connection between the components that are connected or an indirect connection, through additional components (such one or more passive or active intermediary devices as suited for the specific environment).

It should be appreciated that the specific type of transistors (such as NMOS, PMOS, etc.) noted above are merely by way of illustration. However, alternative embodiments using different configurations and transistors with similar characteristics will be apparent to one skilled in the relevant arts by reading the disclosure provided herein.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A level-shifter to receive a binary signal on an input node and to generate an output signal also representing the same logic level of said binary signal, said level-shifter comprising:
    a latch having a first node and a second node, said first node and said second node together providing a pair of complementary binary values, said second node providing said output signal, said output signal representing logic levels in a first voltage range defined with respect to a first constant reference potential in a sequence of first phases of a clock signal and in a second voltage range defined with respect to a second constant reference potential in a sequence of second phases of said clock signal;
    a first transistor having a first current terminal coupled to said first node and a second current terminal coupled to said first constant reference potential;
    a second transistor having a first current terminal coupled to said second node and a second current terminal coupled to said first constant reference potential; and
    a controller block to receive said binary signal, and transfer a logic level of said binary signal only in said first phase, but not in said second phase of said clock signal,
    wherein said first constant reference potential is lower than said second constant reference potential.

2. The level-shifter of claim 1, wherein each of said first voltage range and said second voltage range is defined with respect to a higher voltage value and a lower voltage value,
wherein said first constant reference potential represents the lower voltage value of said first voltage range,
wherein said second constant reference potential represents the lower voltage value of said second voltage range.

3. The level-shifter of claim 1, wherein said controller block is configured to receive said binary signal and an enable signal, said enable signal indicating whether said clock signal is in said first phase or said second phase, said controller block operating to transfer any changes in logic level of said binary signal only when said enable signal indicates that said clock signal is in said first phase.

4. The level-shifter of claim 3, wherein said controller block comprises:
a first AND gate;
a second AND gate; and
a generator block to receive said binary signal and to generate a first output and a second output based on said binary signal,
wherein said first AND gate receives said enable signal and said first output of said generator block,
wherein said second AND gate receives said enable signal and said second output of said generator block,
wherein a gate terminal of said first transistor is coupled to output of said first AND gate,
wherein a gate terminal of said second transistor is coupled to output of said second AND gate.

5. The level-shifter of claim 4, wherein a second current terminal of said first transistor is directly connected to said first node of said latch and a second current terminal of said second transistor is directly connected to said second node of said latch,
wherein a direct connection exists between two nodes such that only a low impedance is present in the direct connection between the nodes.

6. The level-shifter of claim 5, wherein said latch comprises a first inverter with an input node and an output node and a second inverter with an input node and an output node,
wherein said input node of said first inverter is coupled to said output node of said second inverter,
wherein said input node of said second inverter is coupled to said output node of said first inverter,
wherein said input node of said first inverter is coupled to said first node,
wherein said input node of said second inverter is coupled to said second node.

7. The level-shifter of claim 6, wherein said each of said first transistor and said second transistor is an n-type MOSFET (Metal Oxide Semiconductor Field Effect Transistor),
wherein said latch is designed to handle a first maximum voltage rating, wherein each of said first transistor and said second transistor is designed to handle a second maximum voltage rating higher than said first maximum voltage rating.

8. A switching converter comprising:
a smart power stage (SPS), said SPS comprising:
a high-side switch and a low-side switch that together are operable to generate an output voltage at an output node based on an input voltage received at an input node; and
a driver block to drive a control terminal of said high-side switch by a high-side drive signal having voltage levels in a second voltage range to cause said high-side switch to be ON or OFF, wherein said driver block is coupled to receive a configuration bit as input, wherein a logic level of said configuration bit is designed to control a mode of operation of said driver block, each mode of operation designed to cause said driver block to provide a corresponding signal strength of said high-side drive signal, wherein said driver block operates in each of a first voltage range and said second voltage range; and
a level-shifter, wherein said level-shifter is configured to receive a binary signal on a first node, said level-shifter to generate an output signal also representing the same logic level of said binary signal, wherein said driver block receives said output signal as said configuration bit,
wherein said level-shifter comprises:
a latch having a third node and a fourth node, said third node and said fourth node together providing a pair of complementary binary values, said fourth node providing said output signal, said output signal representing logic levels in said first voltage range defined with respect to a first constant reference potential in a sequence of first phases of a clock signal and in said second voltage range defined with respect to a second constant reference potential in a sequence of second phases of said clock signal;
a first transistor having a first current terminal coupled to said third node and a second current terminal coupled to said first constant reference potential;
a second transistor having a first current terminal coupled to the fourth node and a second current terminal coupled to the first constant reference potential; and
a controller block to receive said configuration bit, and transfer a logic level of said configuration bit only in said first phase, but not in said second phase of said clock signal,
wherein said first constant reference potential is lower than said second constant reference potential.

9. The switching converter of claim 8, wherein each of said first voltage range and said second voltage range is defined with respect to a higher voltage value and a lower voltage value,
wherein said first constant reference potential represents the lower voltage value of said first voltage range,
wherein said second constant reference potential represents the lower voltage value of said second voltage range.

10. The switching converter of claim 8, wherein said controller block is configured to receive said configuration bit and an enable signal, said enable signal indicating whether said clock signal is in said first phase or said second phase, said controller block operating to transfer any changes in logic level of said configuration bit only when said enable signal indicates that said clock signal is in said first phase.

11. The switching converter of claim 10, wherein said clock signal is a pulse-width-modulated signal (PWM) received by said driver block, wherein said driver block generates said enable signal based on said PWM signal,
wherein when said clock signal is operating in said first phase:
said PWM signal is a logic LOW,
said enable signal is a logic HIGH,
said driver block is operating in said first voltage range, and
said low-side switch is ON and said high-side switch is OFF, wherein when said clock signal is operating in said second phase:
said PWM signal is a logic HIGH,
said enable signal is a logic LOW,
said driver block is operating in said second voltage range, and
said low-side switch is OFF and said high-side switch is ON.

12. The switching converter of claim 11, wherein said latch comprises a first inverter with an input node and an output node and a second inverter with an input node and an output node,
wherein said input node of said first inverter is coupled to said output node of said second inverter,
wherein said input node of said second inverter is coupled to said output node of said first inverter,
wherein said input node of said first inverter is coupled to said third node,
wherein said input node of said second inverter is coupled to said fourth node.

13. The switching converter of claim 12, wherein each of said first transistor and said second transistor is a n-type MOSFET (Metal Oxide Semiconductor Field Effect Transistor),
wherein said high-side switch is an N-type transistor,
wherein said driver block generates said enable signal having voltage levels in said first voltage range to cause said low-side switch to be ON or OFF,
wherein each of said first transistor and said transistor is coupled to receive a corresponding one of a pair of controls signal to cause one of said first transistor and said second transistor to be ON or OFF based on a logic level of said configuration bit.

14. The switching converter of claim 13, wherein said controller block comprises:
a generator block to receive said configuration bit, wherein said generator block generates a pulse on a first output path and a logic LOW on a second output path when said configuration bit is a logic HIGH,
wherein said generator block generates a pulse on said second output path and a logic LOW on said first output path when said configuration bit is a logic LOW;
a first AND gate coupled to receive said enable signal and the signal on said first output path, and to generate a first one of said pair of control signals; and
a second AND gate coupled to receive said enable signal and the signal on said second output path, and to generate a second one of said pair of control signals.

15. The switching converter of claim 14, wherein said latch is designed to handle a first maximum voltage rating, wherein each of said first transistor and said second transistor is designed to handle a second maximum voltage rating higher than said first maximum voltage rating.

16. A voltage regulator module (VRM) comprising:
a phase controller to generate a regulated supply voltage on a first supply node;
a smart power stage (SPS) of a switching converter, said SPS comprising:
a high-side switch and a low-side switch that together are operable to generate an output voltage at an output node based on an input voltage received at an input node; and
a driver block to drive a control terminal of said high-side switch by a high-side drive signal having voltage levels in a second voltage range to cause said high-side switch to be ON or OFF, wherein said driver block is coupled to receive a configuration bit as input, wherein a logic level of said configuration bit is designed to control a mode of operation of said driver block, each mode of operation designed to cause said driver block to provide a corresponding signal strength of said high-side drive signal, wherein said driver block operates in each of a first voltage range and said second voltage range; and
a level-shifter, wherein said level-shifter is configured to receive a binary signal on a first node, said level-shifter to generate an output signal also representing the same logic level of said binary signal, wherein said driver block receives said output signal as said configuration bit,
wherein said level-shifter comprises:
a latch having a third node and a fourth node, said third node and said fourth node together providing a pair of complementary binary values, said fourth node providing said output signal, said output signal representing logic levels in said first voltage range defined with respect to a first constant reference potential in a sequence of first phases of a clock signal and in said second voltage range defined with respect to a second constant reference potential in a sequence of second phases of said clock signal;
a first transistor having a first current terminal coupled to said third node and a second current terminal coupled to said first constant reference potential;
a second transistor having a first current terminal coupled to the fourth node and a second current terminal coupled to the first constant reference potential; and
a controller block to receive said configuration bit, and transfer a logic level of said configuration bit only in said first phase, but not in said second phase of said clock signal,
wherein said first constant reference potential is lower than said second constant reference potential.

17. The VRM of claim 16, wherein each of said first voltage range and said second voltage range is defined with respect to a higher voltage value and a lower voltage value,
wherein said first constant reference potential represents the lower voltage value of said first voltage range,
wherein said second constant reference potential represents the lower voltage value of said second voltage range.

18. The VRM of claim 16, wherein said controller block is configured to receive said binary signal and an enable signal, said enable signal indicating whether said clock signal is in said first phase or said second phase, said controller block operating to transfer any changes in logic level of said binary signal only when said enable signal indicates that said clock signal is in said first phase.

19. The VRM of claim 18, wherein said clock signal is a pulse-width-modulated signal (PWM) generated by said phase controller and received by said driver block, wherein driver block generates said enable signal based on said PWM signal,
wherein when said clock signal is operating in said first phase:
said PWM signal is a logic LOW,
said enable signal is a logic HIGH,
said driver block is operating in said first voltage range, said low-side switch is ON and said high-side switch is OFF,
wherein when said clock signal is operating in said second phase:
said PWM signal is a logic HIGH, said enable signal is a logic LOW,
said driver block is operating in said second voltage range, said low-side switch is OFF and said high-side switch is ON.

20. The VRM of claim 19, wherein said latch comprises a first inverter with an input node and an output node and a second inverter with an input node and an output node,
wherein said input node of said first inverter is coupled to said output node of said second inverter,
wherein said input node of said second inverter is coupled to said output node of said first inverter,
wherein said input node of said first inverter is coupled to said third node,
wherein said input node of said second inverter is coupled to said fourth node,
wherein said controller block comprises:
a generator block to receive said configuration bit, wherein said generator block generates a pulse on a first output path and a logic LOW on a second output path when said configuration bit is a logic HIGH,
wherein said generator block generates a pulse on said second output path and a logic LOW on said first output path when said configuration bit is a logic LOW;
a first AND gate coupled to receive said enable signal and the signal on said first output path, and to generate a first one of said pair of control signals; and
a second AND gate coupled to receive said enable signal and the signal on said second output path, and to generate a second one of said pair of control signals.

* * * * *